United States Patent [19]

Sakamoto et al.

[11] 4,428,067
[45] Jan. 24, 1984

[54] PRECHARGE FOR SPLIT ARRAY RATIOLESS ROM

[75] Inventors: Takashi Sakamoto, Tachikawa; Jinkichi Suto, Hamura; Hisahiro Moriuchi, Koganei, all of Japan

[73] Assignee: Hitachi, Ltd., Tokyo, Japan

[21] Appl. No.: 290,652

[22] Filed: Aug. 6, 1981

[30] Foreign Application Priority Data

Aug. 13, 1980 [JP] Japan ................................. 55-110225

[51] Int. Cl.³ ........................ G11C 17/00; G11C 7/00
[52] U.S. Cl. .................................... 365/104; 365/203
[58] Field of Search ................................ 365/104, 203

[56] References Cited

FOREIGN PATENT DOCUMENTS 2300390 3/1976 France .
53-80931 7/1978 Japan .
1544663 4/1979 United Kingdom .
2060303A 4/1981 United Kingdom .

Primary Examiner—George G. Stellar
Attorney, Agent, or Firm—Antonelli, Terry & Wands

[57] ABSTRACT

A semiconductor read-only memory is constructed of first and second read-only memories of the ratioless type each of which includes a plurality of MISFETs connected in series, and a logic circuit which logically combines output signals of the first and second read-only memories. When the output of the first read-only memory is to be determined by an input signal level thereof, the second read-only memory is forcibly brought into a precharge state. As a result, even when an undesirable coupling capacitor exists between an output terminal of the first read-only memory and an output terminal of the second read-only memory, the signal from the first read-only memory can be provided at the proper level.

10 Claims, 10 Drawing Figures

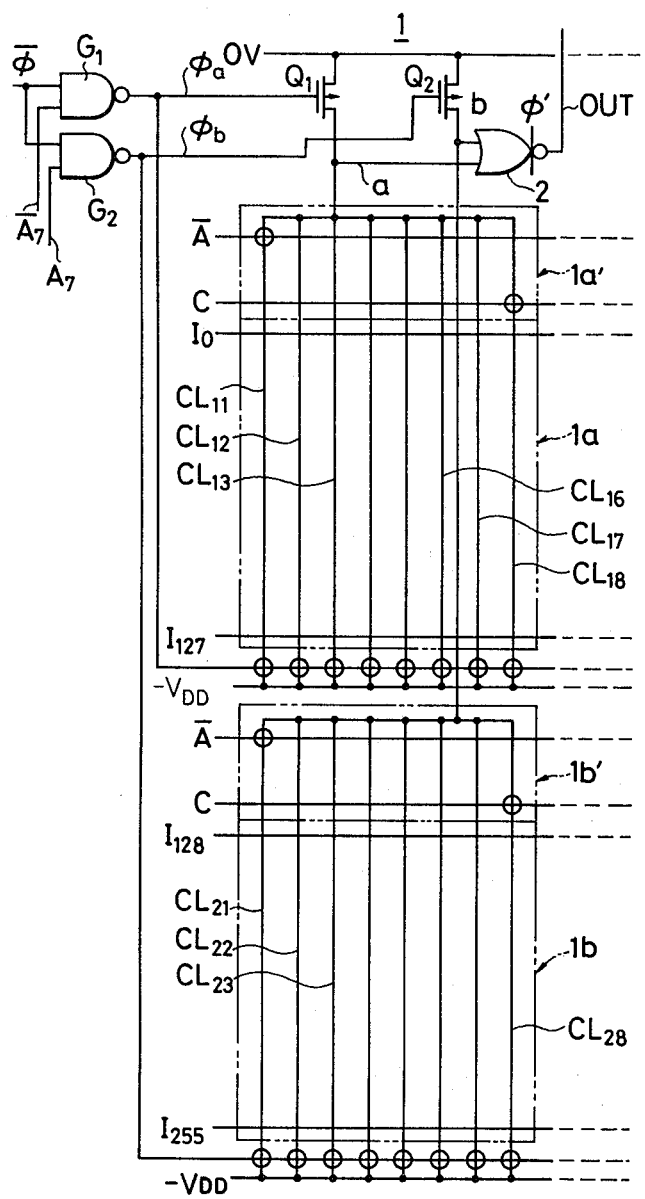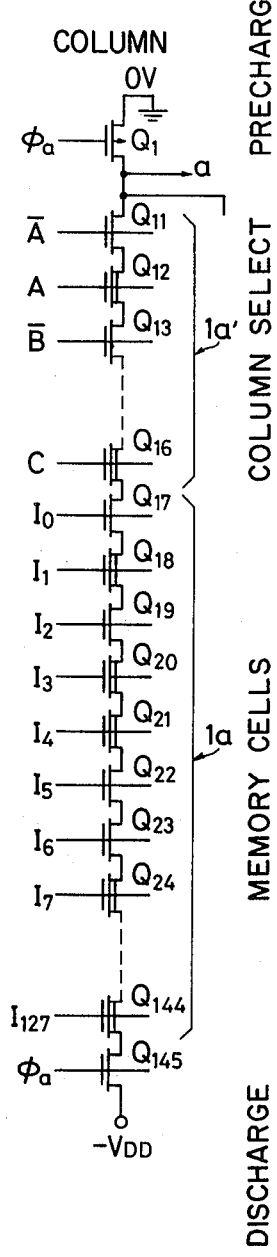

NOR

2

PRECHARGE FOR SPLIT ARRAY RATIOLESS ROM

BACKGROUND OF THE INVENTION

This invention relates to a semiconductor read-only memory (hereinbelow, termed "ROM"), and more particularly to a longitudinal type ROM.

As disclosed in, for example, the specification of U.S. Pat. No. 4,240,151, a longitudinal type ROM constituting a logic block (memory array) is constructed of a plurality of insulated-gate field effect transistors (hereinbelow, termed "MISFETs") which are connected in series. Each of the plurality of series MISFETs is made the depletion mode or the enhancement mode, depending upon the information to be written into the memory.

More specifically, among the MISFETs connected in series, one to be switched and controlled by an input signal is made the enhancement mode, and one not to be switched and controlled by an input signal is made the depletion mode.

The longitudinal type ROM has features as stated below. The source of one of the MISFETs adjacent to each other and the drain of the other MISFET are electrically connected in common. Accordingly, the source semiconductor region of one MISFET and the drain semiconductor region of the other MISFET which are formed in a single semiconductor substrate by the semiconductor integrated circuit technology can be constructed of a common semiconductor region. Since the source region and drain region of the adjacent MISFETs can be connected without using an evaporated aluminum interconnection layer or the like, a contact area on the semiconductor substrate can be reduced. In a semiconductor integrated circuit (IC), accordingly, the ROM can be formed to occupy a comparatively small area. The longitudinal type ROM is suitable especially in a case where the IC is constructed of MISFETs, such as silicon gate MISFETs, in which the source region and the drain region are formed in self-alignment with the gate electrode.

In the longitudinal type ROM, however, it must be attended to that the MISFETs in a number corresponding to the number of input terminals of the ROM are connected in series, that the "on" resistance value of the entire series connection of the MISFETs becomes a comparatively great value, and that parasitic capacitances which limit the operating speed of the circuit increase due to an increase in the number of the MISFETs.

In, for example, a longitudinal type ROM which is employed as an OR array in a PLA (programmable logic array), a comparatively large number of MISFETs are connected in series in correspondence with the number of input terminals of the ROM. As a result, the "on" resistance value of the whole series connection of the MISFETs becomes conspicuously great, and the parasitic capacitances increase. When the number of the input terminals to be supplied with address signals has increased in this manner, the read speed of data lowers.

By way of example, in order to fabricate a ROM having program addresses of 256 steps, 256 series MISFETs are required.

The problem concerning the speed can be solved by the use of a divided type longitudinal ROM which is disclosed in, for example, the official gazette of Japanese Laid-open Patent Application No. 53-80931. In this ROM, MISFETs to be supplied with input signals are divided into a plurality of groups, and output signals from the serially-connected MISFETs in the respective groups are logically combined by logic circuits. The divided type longitudinal ROM exhibits comparatively-high operating speed characteristics because the number of the MISFETs to be connected in series is reduced.

It has been revealed, however, that when the divided type longitudinal ROM is put into the form of an IC, circuit is liable to malfunctions on account of the undesirable capacitance coupling between one circuit node and another circuit node.

SUMMARY OF THE INVENTION

It is accordingly an object of this invention to provide a divided type longitudinal ROM which can prevent malfunctions.

Another object of this invention is to provide a divided type longitudinal ROM which is capable of a higher speed operation.

Another object of this invention is to provide a divided type longitudinal ROM which is of comparatively low power dissipation.

Still another object of this invention is to provide a divided type longitudinal ROM in which the layout of circuit elements as well as interconnections is little limited.

Yet another object of this invention is to provide a divided type longitudinal ROM which is suited to be constructed of complementary MISFETs.

Further objects of this invention will become apparent from the following description taken in conjunction with the drawings.

BRIEF DESCRIPTION OF THE DRAWINGS

FIG. 4 is a logic circuit diagram of an embodiment of this invention, FIG. 5 is a concrete circuit diagram showing the essential portions of the embodiment.

DESCRIPTION OF THE PREFERRED EMBODIMENTS

Figure 1:
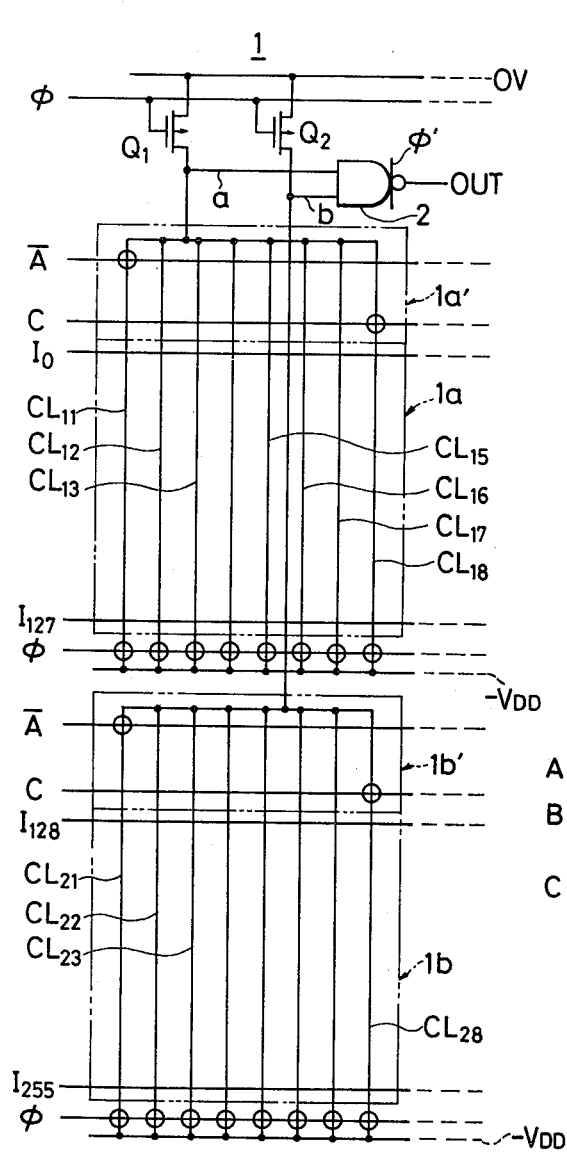
FIG. 1 is a logic circuit diagram showing an example of a longitudinal type ROM.

FIG. 1 shows the logic circuitry of a divided type longitudinal ROM which has been considered by the inventors in developing an improvement of the arrangement taught in the aforecited official gazette of Japanese Laid-open Patent Application No. 53-80931 to facilitate the IC implementation. Although the actual preferred embodiment of the present invention is set forth in FIG. 4, in order to facilitate understanding of this invention, the logic circuitry shown in FIG. 1 will be described before referring to preferred embodiment of this invention.

In FIG. 1, a longitudinal type ROM 1 is so constructed as to have program addresses of 256 steps as a whole. According to the concept of the division, the longitudinal type ROM 1 is divided into, for example, a longitudinal type ROM 1a receiving address decode signals $I_0$–$I_{127}$ and a longitudinal type ROM 1b receiving address decode signals $I_{128}$–$I_{255}$. Read signals a and b delivered from the respective divided longitudinal type ROMs 1a and 1b are supplied to a logic circuit 2. A read output signal OUT for all the address decode signals $I_0$–$I_{255}$ is formed by the logic circuit 2.

In this example of the circuitry, the respective longitudinal type ROMs 1a and 1b include eight column lines $CL_{11}$–$CL_{18}$ and $CL_{21}$–$CL_{28}$. Some of the column lines $CL_{11}$–$CL_{18}$ and $CL_{21}$–$CL_{28}$ constitute column select portions 1a' and 1b' which receive 3-bit column select signals $\overline{A}$–C of a true level and a false level.

Although not clearly shown in FIG. 1, it is to be understood that each of the column lines $CL_{11}$–$CL_{18}$ in the longitudinal type ROM 1a is constructed of a plurality of MISFETs whose sources and drains are connected in series and whose gates are respectively supplied with the signals $\overline{A}$–C and $I_0$–$I_{127}$. Likewise, each of the column lines $CL_{21}$–$CL_{28}$ in the longitudinal type ROM 1b is constructed of a plurality of MISFETs connected in series. Among the MISFETs constituting each column line, those to be switched and controlled by the input signals are made the enhancement mode, and the others are made the depletion mode.

Each of the column select portions 1a' and 1b' has the modes of its MISFETs determined so that, among the eight column lines, only one corresponding to the 3-bit column select signal may be selected.

Each of the address decode signals $I_0$–$I_{127}$ and $I_{128}$–$I_{255}$ provided from an address decoder not shown has its non-selection level set at a level which brings the MISFETs in the column line into their "on" states, and has its selection level set at a level which brings the MISFETs of the enhancement mode in the column line into their "off" state.

Since the divided ROMs 1a and 1b have eight column lines respectively, the longitudinal type ROM shown in FIG. 1 has addresses corresponding to 256×8 or 2,048 program steps. By adopting the divided structure and the column selecting structure in this manner, the number of MISFETs which are connected in series within the longitudinal type ROM can be reduced comparatively greatly.

The longitudinal type ROM 1 shown in FIG. 1 is constructed as a ratioless type logic circuit for the following reason. In a case where logic blocks are constructed of a large number of series MISFETs, it is difficult to properly set the mutual conductance ratio between load means and the series MISFETs. As a result, it becomes difficult to form an output signal of desired level. Therefore, an output load capacitance (not shown) is precharged by precharge MISFETs $Q_1$ and $Q_2$ which are switched and controlled by a clock pulse $\phi$, whereupon discharge MISFETs (indicated by marks O) which are disposed between the series MISFETs and a supply voltage $-V_{DD}$ are turned "on" by the pulse $\phi$. When the discharge MISFETs are turned "on", whether or not charges stored at output points a and b in advance are discharged is determined depending upon the "on" states or "off" states of the series MISFETs.

In a case where the IC is constructed of complementary MISFETs, channel types are selected by way of example so that the precharge MISFETs $Q_1$ and $Q_2$ may be of the p-channel type, while the series MISFETs including the column select portions and the discharge MISFETs may be of the n-channel type.

The operation of the circuit shown in FIG. 1 is as follows in a case, for example, where the column select signals $\overline{A}$–C are set so as to select the column lines $CL_{11}$ and $CL_{21}$ and where the address decode signals $I_0$–$I_{255}$ are set so as to select the first address input terminal.

First, the clock pulse $\phi$ is made a low level as the supply voltage $-V_{DD}$, whereby the precharge MISFETs $Q_1$ and $Q_2$ fall into the "on" states, with the result that the output points a and b of the longitudinal type ROMs 1a and 1b are precharged substantially to the ground potential of the circuit.

Subsequently, the clock pulse $\phi$ is made a high level as the ground potential of the circuit, whereby the precharge MISFETs $Q_1$ and $Q_2$ fall into the "off" states, and the discharge MISFETs fall into the "on" states. At this time, the first address decode signal $I_0$ is at the selection level or the low level substantially equal to the supply voltage $-V_{DD}$, while the remaining address decode signals are at the non-selection level or the high level substantially equal to the ground potential. Accordingly, all the MISFETs constituting the column line $CL_{21}$ are brought into the "on" states even when they are made the enhancement mode. As a result, the output point b is discharged to the level approximately equal to the supply voltage $-V_{DD}$ in correspondence with the non-selection level of all the address decode signals $I_{128}$–$I_{255}$. On the other hand, when that one of the MISFETs constituting the column line $CL_{11}$ which is supplied with the address decode signal $I_0$ of the selection level is held in the "off" state by being made the enhancement mode in advance, the output point a is maintained at the precharge level or the high level. In contrast, when the MISFET which receives the address decode signal $I_0$ of the selection level is made the depletion mode in advance, the output point a is changed to the low level. In other words, in the divided type longitudinal ROMs 1a and 1b, one supplied with the address decode signals of the selection level provides the signal of the high level or low level, and the other not supplied with the address decode signals of the selection level provides the signal of the low level.

The signals delivered to the output points a and b are supplied to the logic circuit 2 which essentially performs the OR operation, and are thus converted into one signal. In case of the illustrated circuit, the logic circuit 2 is constructed of a NAND circuit which receives the low level as the logic level "1".

Figure 2:
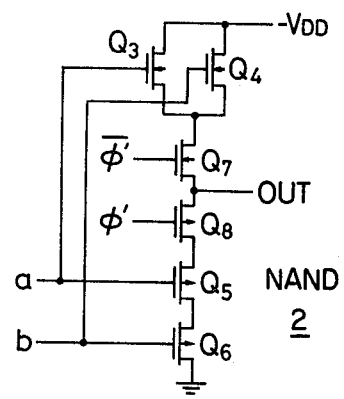
FIG. 2 is a circuit diagram showing an example of an output logic circuit shown in FIG. 1.

FIG. 2 shows a concrete circuit diagram of the logic circuit 2.

This circuit 2 is constructed of a complementary circuit which is clock-driven by sampling pulses $\phi'$ and $\overline{\phi'}$. When the output point b is at the low level as stated above, a p-channel MISFET $Q_6$ is brought into the "on" state and an n-channel MISFET $Q_4$ into the "off" state by the low level. At this time, when the output point a is at the high level, an n-channel MISFET $Q_3$ is brought into the "on" state and a p-channel MISFET $Q_5$ into the "off" state by the high level. As a result, when MISFETs $Q_7$ and $Q_8$ are brought into the "on" states by the sampling pulses $\phi'$ and $\overline{\phi'}$, the output OUT is made the low level.

When a data signal or control signal of a plurality of bits needs to be provided from one address, the circuits as shown in FIG. 1 are juxtaposed.

In case of putting the circuit of FIG. 1 into the form of an IC, the logic circuit 2 is located outside the ROMs 1a and 1b as in the circuit arrangement of FIG. 1 for the purpose of shortening an interconnection to another circuit which receives the output thereof.

Although not specifically restricted, the logic circuit 2 is arranged outside the longitudinal type ROM 1a. In this case, the output line of the longitudinal type ROM 1b is extended above the column lines of the longitudinal type ROM 1a and then coupled with one input terminal of the logic circuit 2.

In such divided type longitudinal ROM, however, an undesirable coupling capacitance (not shown) of comparatively large value is formed between the output line of the longitudinal type ROM 1b and a specified column of the longitudinal type ROM 1a. For example, in case where the output line of the longitudinal type ROM 1b is arranged in proximity to the column line $CL_{16}$ of the longitudinal type ROM 1a, a coupling capacitance of comparatively large value is formed therebetween. Such coupling capacitance brings the circuit of FIG. 1 into malfunctions.

By way of example, when the output point a of the longitudinal type ROM 1a ought to be made the high level by the specified column line $CL_{16}$, the situation is as follows.

Figure 3:
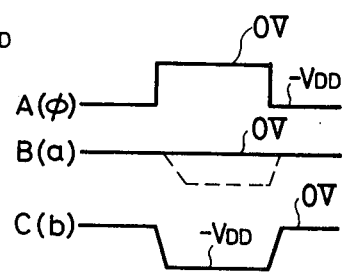
FIG. 3 is a signal waveform diagram of the circuit shown in FIG. 2.

In a case where the discharge operation has been initiated after the precharge operation, the output point b is changed to the low level approximately equal to the supply voltage $-V_{DD}$ as previously described because all the address decode signals $I_{128}-I_{255}$ are made the non-selection level. At this time, on account of the comparatively large coupling capacitance between the output point b or the output line of the longitudinal type ROM 1b and the column line $CL_{16}$, the potential of the column line $CL_{16}$ is undesirably changed toward the low level as indicated by a broken line in line B of FIG. 3. During the period of the discharge operation, the precharge MISFET $Q_1$ is held in the "off" state, so that the output point a is held in its high impedance state. Accordingly, the potential of the column line $CL_{16}$ or the output point a lowered through the coupling capacitance is maintained at the lowered level until the precharge operation is started again. When the potential of the output point a has been lowered beyond the logic threshold voltage of the logic circuit 2, a signal of an erroneous level or the high level is provided from the logic circuit 2 in response thereto.

The coupling capacitance is changed depending upon which of the address decode signals $I_o-I_{127}$ is made the selection level.

One possible way to attempt to prevent the formation of the undesirable coupling capacitance as above described is by arranging the logic circuit 2 in the intermediate area between the divided longitudinal type ROMs 1a and 1b. In such case, note must be taken of the following.

In order to supply the output signal of the logic circuit 2 to another circuit arranged around the longitudinal ROM 1a or 1b, the output line of the logic circuit 2 needs to be extended above, for example, the ROM 1a or ROM 1b. Therefore, a coupling capacitance similar to the foregoing is formed, and a crosstalk resulting in the malfunction of the circuit occurs. On the other hand, it is possible to supply the output signal of the logic circuit arranged between the longitudinal type ROMs 1a and 1b, to another circuit through a detour interconnection. In this case, however, a sufficient area for forming the detour interconnection must be secured between and around the longitudinal type ROMs 1a and 1b. As a result, the occupying area of a monolithic IC chip must be increased.

In a case where the longitudinal type ROM is divided into three or more parts, the formation of the logic circuits among the divided longitudinal type ROMs as described above has no special significance in the decrease of the coupling capacitance or the reduction of the detour interconnection area as described above.

In a case where the longitudinal type ROM is formed of the complementary MISFETs as described above and where the logic circuit 2 is arranged around the divided longitudinal type ROMs 1a and 1b, a plurality of n-channel MISFETs for constructing the longitudinal type ROMs 1a and 1b can be formed within an identical p-type well region. As a result, the density of integration of the IC can be enhanced.

According to this invention, the precharge operation and discharge operation in the divided type longitudinal ROM are controlled by a control signal such as the address signal. At a discharge timing or sampling timing, the output level of one of the plurality of divided longitudinal ROMs is changed depending upon the input signals thereof and the modes of the MISFETs included therein. The output level of any other divided longitudinal ROM is not changed by the control of the precharge operation. As a result, an erroneous circuit operation does not occur even in the presence of the undesirable coupling capacitance as stated before.

FIG. 4 is a diagram of a logic circuit arrangement embodying this invention.

In this embodiment, a longitudinal type ROM 1 is divided into two longitudinal ROMs 1a and 1b which include column select portions 1a' and 1b' respectively.

The divided longitudinal ROMs 1a and 1b include eight column lines $CL_{11}-CL_{18}$ and $CL_{21}-CL_{28}$, respectively.

The longitudinal ROM 1a is supplied with 3 bits of column select signals $\overline{A}-C$ having the true level and false level, and 128 bits of address decode signals $I_o-I_{127}$ formed by an address decoder not shown. Similarly, the longitudinal ROM 1b is supplied with 3 bits of column select signals $\overline{A}-C$ and 128 bits of address decode signals $I_{128}-I_{255}$.

Each of the column lines $CL_{11}-CL_{18}$ and $CL_{21}-CL_{28}$ is constructed of a plurality of MISFETs whose sources and drains are connected in series.

Those serially-connected MISFETs in the longitudinal ROM 1a which are supplied with the address decode signals $I_o-I_{127}$, and those serially-connected MISFETs in the longitudinal ROM 1b which are supplied with the address decode signals $I_{127}-I_{255}$ constitute memory arrays essentially.

Discharge means constructed of n-channel type MISFETs (indicated by marks O in FIG. 4) are disposed between each of the longitudinal ROMs 1a and 1b and a supply voltage terminal $-V_{DD}$.

In addition, precharge means constructed of p-channel type MISFETs $Q_1$ and $Q_2$ are respectively disposed between the column select portions 1a' and 1b' and a reference potential terminal 0 V.

FIG. 5 shows a concrete circuit of one column line of the longitudinal ROM 1a, for example, $CL_{11}$.

The column line shown in FIG. 5 is constructed of a series connection which consists of 6 n-channel type MISFETs $Q_{11}$–$Q_{16}$ constituting the column select portion, 128 n-channel type MISFETs $Q_{17}$–$Q_{144}$ constituting the memory array, and a discharge MISFET $Q_{145}$. The precharge MISFET $Q_1$ of the p-channel type is connected between the column line and the reference potential terminal 0 V, while the discharge MISFET $Q_{145}$ is connected between the column line and the supply voltage terminal $-V_{DD}$.

In FIG. 5, the MISFETs such as the MISFET $Q_{12}$ in which straight lines are drawn across their sources and drains are made the depletion mode. The other MISFETs are made the enhancement mode.

In the circuit of FIG. 5, the serially-connected MISFETs $Q_{11}$–$Q_{16}$ constituting the column select portion $1a'$ have their modes determined as follows.

In case of employing the column select signals A, $\overline{A}$-C, $\overline{C}$ corresponding to 3 bits of binary data $2^0$–$2^2$, in order to decode the first status of the column select signals A, $\overline{A}$-C, $\overline{C}$, the MISFETs $Q_{11}$, $Q_{13}$ and $Q_{15}$ (not shown) which receive the signals $\overline{A}$, $\overline{B}$ and $\overline{C}$ of the false level are made the enhancement mode, and the MISFETs $Q_{12}$, $Q_{14}$ (not shown) and $Q_{16}$ which receive the signals A, B and C of the true level are made the depletion mode. Accordingly, when the signals $\overline{A}$, $\overline{B}$ and $\overline{C}$ are at the high level, i.e., when the 3-bit binary data are put into the first status, the MISFETs $Q_{11}$, $Q_{13}$ and $Q_{15}$ are brought into the "on" states. As a result, the first column line is coupled to the output point a.

If the second column line is constructed of the MISFETs $Q_{17}$–$Q_{144}$ in FIG. 5, the MISFETs $Q_{12}$, $Q_{13}$ and $Q_{15}$ receiving the signals A, $\overline{B}$ and $\overline{C}$ are made the enhancement mode and the remaining MISFETs $Q_{11}$, $Q_{14}$ and $Q_{16}$ are made the depletion mode so as to decode the second status of the column select signals A, $\overline{A}$-C, $\overline{C}$. Likewise, if the eighth column line is constructed of the MISFETs $Q_{17}$–$Q_{144}$, the MISFETs $Q_{12}$, $Q_{14}$ and $Q_{16}$ receiving the signals A, B and C are made the enhancement mode and the remaining MISFETs are made the depletion mode so as to decode the eighth status of the column select signals A, $\overline{A}$-C, $\overline{C}$.

The MISFETs $Q_{17}$–$Q_{144}$ which constitute the memory array are set at the depletion mode or the enhancement mode in accordance with write information.

As shown by way of example in the figure, the MISFETs $Q_{17}$, $Q_{19}$, $Q_{22}$ and $Q_{23}$ are made the enhancement mode, and the remaining MISFETs are made the depletion mode. That is, in the column of FIG. 5, the MISFETs corresponding to addresses 0, 2, 5 and 6 are made the enhancement mode. Accordingly, when the column shown in FIG. 5 is selected in correspondence with the first status of the column select signals A, $\overline{A}$-C, $\overline{C}$ and the address 0, 2, 5 or 6 is selected by the selection level (low level) of the address decode signal $I_0$, $I_2$, $I_5$ or $I_6$, one of the enhancement mode MISFETs is responsively brought into the "off" state. In this case, the output a becomes the high level. When any address other than the aforecited addresses is selected, the address decode signals $I_0$, $I_2$, $I_5$ and $I_6$ are made the non-selection level (high level), whereby the MISFETs $Q_{17}$, $Q_{19}$, $Q_{22}$ and $Q_{23}$ are brought into the "on" states. Therefore, the output a is made the low level.

Since the discharge MISFET $Q_{145}$ needs to perform the switching operation, it is naturally constructed in the enhancement mode.

The longitudinal ROM $1b$ is constructed similarly to the above.

The longitudinal type ROM 1 composed of the divided longitudinal ROMs $1a$ and $1b$ provides a signal of 1 bit in response to an input address signal. Accordingly, a plurality of such longitudinal type ROMs 1 are disposed in parallel in order to provide from one address a predetermined program instruction constructed of a plurality of bits.

The longitudinal type ROM described above can be formed on a single semiconductor substrate by the known semiconductor integrated circuit (IC) technology.

Although no restriction is intended, the p-channel type MISFETs are formed in the surface of a semiconductor substrate as made of n-type single crystal silicon, and the n-channel type MISFETs are formed in the surface of a p-type well region which is formed in the surface of the semiconductor substrate.

The p-channel type and n-channel type MISFETs are so constructed as to have gate electrodes which are made of, for example, polycrystalline silicon layers. The source region and drain region of each MISFET are formed by the self-alignment technique in which the corresponding gate electrode is utilized as a mask.

Figure 9:
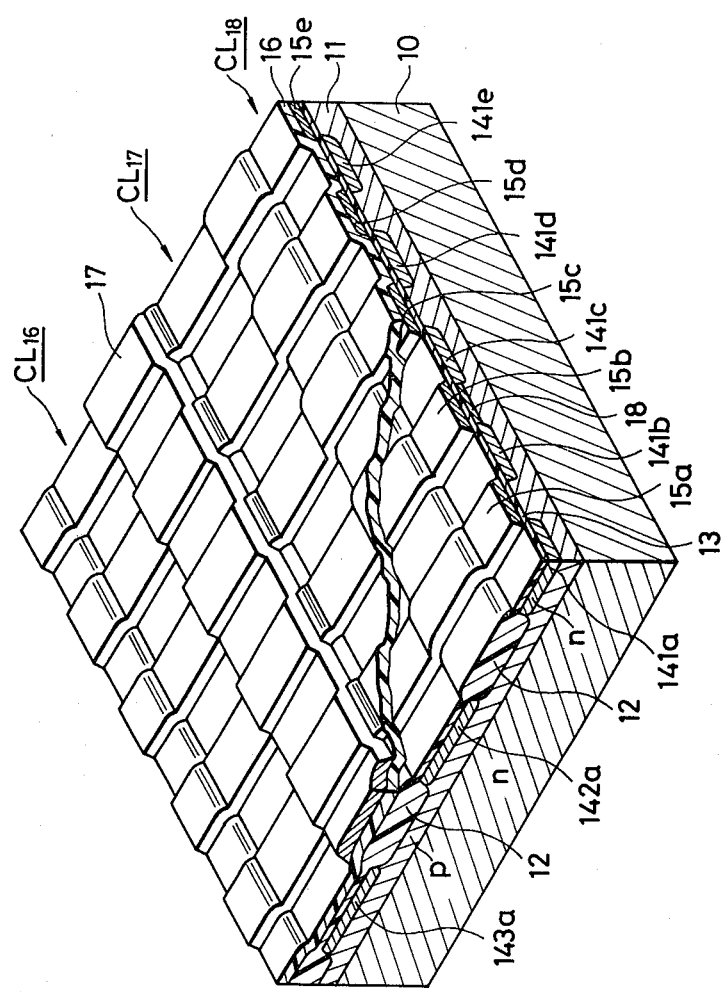
FIG. 9 is a perspective view of a semiconductor read-only memory.

FIG. 9 shows a partially sectional and broken perspective view of the MISFETs constituting the longitudinal ROM $1a$.

Referring to the figure, a p-type well region 11 is formed in the surface of an n-type semiconductor substrate 10. Although this is not especially restrictive, a field oxide film 12 of a comparatively great thickness of, e.g., approximately 1 μm is formed on the surface of the p-type well region 11 by the known selective thermal oxidation. A gate oxide film 13 of a comparatively small thickness of, e.g., approximately 500 Å is formed on the surface of the p-type well region 11 not covered with the field oxide film 12, that is, the surface corresponding to an active region. A plurality of n-type polycrystalline silicon layers $15a$–$15e$ which construct the input lines of the ROM and the gate electrodes of the MISFETs are extended on the field oxide films 12 and the gate oxide films 13.

In the surface of the p-type well region 11 covered with neither the field oxide films 12 nor the polycrystalline silicon layers $15a$–$15e$, there are formed n-type semiconductor regions $141a$–$141e$, $142a$ and $143a$ which function as the source regions and drain regions of the MISFETs. The n-type semiconductor regions are formed by the known self-alignment technique in which the field oxide films 12 and the polycrystalline silicon layers are used as a mask for implanting the ions of an n-type impurity.

As apparent from the figure, one of the plurality of MISFETs constituting the column line $CL_{18}$ by way of example is constructed of the n-type semiconductor regions $141a$ and $141b$, the gate oxide film 13 and the n-type polycrystalline silicon layer $15a$.

As illustrated in FIG. 9, the MISFET in which an n-type semiconductor region 18 is formed in the surface of the p-type well region 11 underlying the gate electrode $15b$ is made the enhancement mode. The n-type semiconductor region 18 is formed by the ion implantation technique. By way of example, after forming the gate oxide film 13, a photoresist film is formed on the surface of the semiconductor substrate. Subsequently, the photoresist film is removed from parts which are to form the channel regions of the depletion mode MISFETs. At the next step, using the photoresist film as a mask, n-type impurity ions such as phosphorus ions are implanted into the surface of the p-type well region 11 through the gate oxide film 13. As a result, the n-type semiconductor region 18 is formed.

In the longitudinal type ROM, the depletion mode MISFET is not utilized as a switching element, but it is utilized rather as the cross interconnection between the input line such as the polycrystalline silicon layer and the column line. In case of utilizing the depletion mode MISFET as the cross interconnection in this manner, it can be made the same size as that of the enhancement mode MISFET and does not require any special contact region, so that the arrayal of the MISFETs of the matrix arrangement in FIG. 9 is not disordered.

In the embodiment of FIG. 9, an insulating film 16 of comparatively great thickness which is made of, e.g., phosphosilicate glass and which serves as the inter-layer insulating film of multilayer interconnections is further formed on the surface of the semiconductor substrate 10 including the surfaces of the polycrystalline silicon layers. An interconnection layer 17 which is made of, e.g., evaporated aluminum is formed on the surface of the insulating film 16.

The interconnection layer 17 is used as the output interconnection of the longitudinal ROM 1b shown in FIG. 4. As seen from FIG. 9, the interconnection layer 17 is extended substantially on the field oxide film 12. That is, the interconnection layer 17 is extended so as to avoid positions over the MISFET forming regions to the utmost. Since, however, the interconnection layer 17 is comparatively proximate to the column lines $CL_{16}$ and $CL_{17}$, it forms unnegligible coupling capacitances with these column lines. To the end of reducing the coupling capacitances, that part of the field oxide film 12 on which the interconnection layer 17 is to be extended can be widened. This measure, however, results in lowering the density of integration of the longitudinal ROM 1a.

In the circuit arrangement of this embodiment, in order to prevent any malfunction attributed to the coupling capacitances as stated above, clock pulses $\bar{\phi}$ are impressed on the respective precharge MISFETs $Q_1$ and $Q_2$ and discharge MISFETs of the longitudinal ROMs 1a and 1b through gate circuits $G_1$ and $G_2$.

As shown in FIG. 4, each of the gate circuits $G_1$ and $G_2$ is constructed of a 2-input NAND circuit. One input terminal of each of the gate circuits $G_1$ and $G_2$ is supplied with the clock pulse $\bar{\phi}$, while the other input terminals of the respective gate circuits $G_1$ and $G_2$ are supplied with gate control signals $\bar{A_7}$ and $A_7$.

The gate control signal $\bar{A_7}$ is brought into its low level or negative logic level "1" in response to the fact that one of the address decode signals $I_0$–$I_{127}$ is made the selection level or the low level substantially equal to the supply voltage $-V_{DD}$. On the other hand, the gate control signal $\bar{A_7}$ is brought into its low level in response to the fact that one of the address decode signals $I_{128}$–$I_{255}$ is made the selection level.

Accordingly, the gate control signals $\bar{A_7}$ and $A_7$ can be made coincident with the address input signal of the most significant bit which is applied to the address decoder circuit, not shown, for forming the 256 kinds of address decode signals $I_0$–$I_{255}$.

Figure 6:
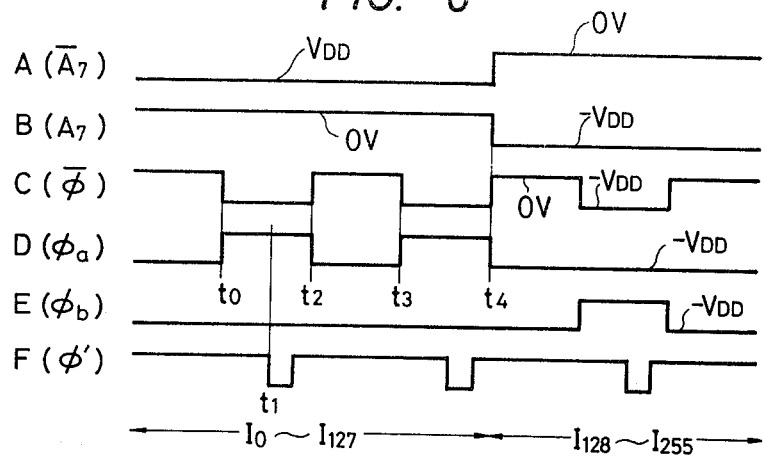
FIG. 6 is a timing chart of the circuit shown in FIG. 4.

As illustrated in line D of FIG. 6, clock pulses $\phi_a$ which are provided from the gate $G_1$ are made a signal which is opposite in phase to the clock pulses $\bar{\phi}$ in the period of the low level of the gate control signal $\bar{A_7}$ and which is maintained at the low level irrespective of the changes of the clock pulses $\bar{\phi}$ during the period of the high level of the gate control signal $\bar{A_7}$. Likewise, clock pulses $\phi_b$ which are provided from the gate circuit $G_2$ are changed according to the changes of the clock pulses $\bar{\phi}$ in only the period of the low level of the gate control signal $A_7$ as illustrated in line E of FIG. 6.

Owing to the provision of the gate circuits $G_1$ and $G_2$, the operations of the longitudinal ROMs 1a and 1b become as follows.

When any of the address decode signals $I_0$–$I_{127}$ is made the selection level by the address decoder circuit not shown, the gate control signal $\bar{A_7}$ is brought into the low level as shown in line A of FIG. 6 by way of example, so that the clock pulse $\phi_a$ is changed in correspondence with the clock pulse $\bar{\phi}$.

When the clock pulse $\phi_a$ is held at the low level approximately equal to the supply voltage $-V_{DD}$, the precharge MISFET $Q_1$ is correspondingly held in the "on" state. Accordingly, the output point a of the longitudinal ROM 1a is precharged substantially to the ground potential of the circuit arrangement.

When the clock pulse $\phi_a$ is made the high level approximately equal to the ground potential, the precharge MISFET $Q_1$ is correspondingly brought into the "off" state, and the discharge MISFET $Q_{145}$ is brought into the "on" state. As a result, the potential of the output point a is made a value which is determined by the arrangement of the memory array.

During the period during which the gate control signal $\bar{A_7}$ is held at the low level, the gate control signal $A_7$ is held at the high level as illustrated in line B of FIG. 6. The clock pulse $\phi_b$ is maintained at the low level irrespective of the level change of the clock pulse $\bar{\phi}$. Since the precharge MISFET $Q_2$ is held in the "on" state by the clock pulse $\phi_b$ of the low level, the output line of the longitudinal ROM 1b is maintained at the precharge level or ground potential.

Since the output line of the longitudinal ROM 1b is maintained at the precharge level, the output point of the longitudinal ROM 1a is not given any noise lowering its level undesirably.

In case where the circuit arrangement as shown in FIG. 4 is not conformed with, a potential change in the predetermined column line of the longitudinal ROM 1a is given to the output line of the longitudinal ROM 1b through the undesirable coupling capacitance.

In contrast, the circuit arrangement shown in FIG. 4 is provided with the gate circuit $G_1$ as described above, so that the clock pulse $\phi_a$ is maintained at the low level when any of the address decode signals $I_{128}$–$I_{255}$ is made the selection level.

Thus, when any of the address decode signals $I_{128}$–$I_{255}$ is selected, the output line of the longitudinal ROM 1a is maintained at the precharge level. As a result, the output line of the longitudinal ROM 1b is not given any noise lowering its level undesirably.

Since, in the circuit arrangement shown in FIG. 4, the output level of one of the longitudinal ROMs 1a and 1b is maintained at the precharge level or high level, a logic circuit 2 is constructed of a 2-input NOR circuit which regards the high level input as the negative logic level "0". A concrete circuit of the negative logic NOR circuit is shown in FIG. 10.

This NOR circuit is constructed of n-channel type MISFETs $Q_3'$, $Q_4'$ and $Q_7$ which are connected in series between a supply voltage terminal $-V_{DD}$ and an output terminal OUT, and p-channel type MISFETs $Q_8$, $Q_5'$ and $Q_6'$ which are connected between the output terminal OUT and the ground point of the circuit.

The gates of the MISFETs $Q_7$ and $Q_8$ are respectively supplied with sampling pulses $\phi'$ and $\overline{\phi'}$.

Figure 10:
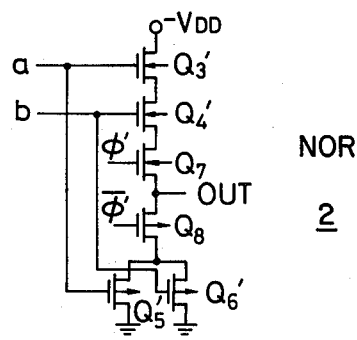
FIG. 10 is a circuit diagram of an output logic circuit.

The circuit of the arrangement as shown in FIG. 10 has an advantage as stated below.

The rate of change of an output signal at the output terminal OUT is limited by capacitances (not shown) such as stray capacitances substantially coupled to the output terminal, and the "on" resistances of the switching MISFETs. In case where all the MISFETs shown in FIG. 10 have equal "on" resistances, the changing rate of the output signal from the high level (0 V) to the low level ($-V_{DD}$) thereof is greatly limited because the three MISFETs $Q_3'$, $Q_4'$ and $Q_7$ are connected between the supply voltage terminal $-V_{DD}$ and the output terminal OUT and the two MISFETs $Q_8$ and $Q_5'$ or $Q_8$ and $Q_6'$ are connected between the output terminal OUT and the ground terminal. In this regard, in order to make high the changing rate of the output signal from the high level to the low level, the "on" resistances of the MISFETs $Q_3'$, $Q_4'$ and $Q_7$ need to be sufficiently lowered in comparison with those of the MISFETs $Q_8$, $Q_5'$ and $Q_6'$.

As is well known, the "on" resistance of a MISFET is proportional to the ratio W/L between the channel width W and channel length L thereof. In general, the channel length L of the MISFET to be put into the form of an IC has its lower limit determined by a dimensional accuracy in the fabricating technology. Accordingly, the MISFET to exhibit a lower "on" resistance has its channel width W made great and comes to occupy a comparatively large area. Since an n-channel type MISFET has a comparatively great mobility for electrons, it exhibits a low "on" resistance as compared with a p-channel type MISFET even when made comparatively small in size.

In the circuit shown in FIG. 10, the MISFETs $Q_3'$, $Q_4'$ and $Q_7$ whose "on" resistances need to be especially lowered are made the n-channel type. Accordingly, the area on a semiconductor substrate for forming the MISFETs may be comparatively small.

In the foregoing circuit shown in FIG. 2, the MISFETs $Q_8$, $Q_5$ and $Q_6$ whose "on" resistances need to be especially lowered are made the p-channel type. Accordingly, a semiconductor substrate requires a comparatively large area for forming the MISFETs.

In the circuit arrangement shown in FIG. 4, either of the clock pulses $\phi_a$ and $\phi_b$ is maintained at the low level, whereby the discharge MISFETs in one of the longitudinal ROMs 1a and 1b are held in the "off" states. That is, the discharge operation in one of the longitudinal ROMs 1a and 1b is inhibited. As a result, the reduction of the power dissipation of the circuit arrangement can be achieved together with the prevention of the malfunction as stated before.

Figure 7:
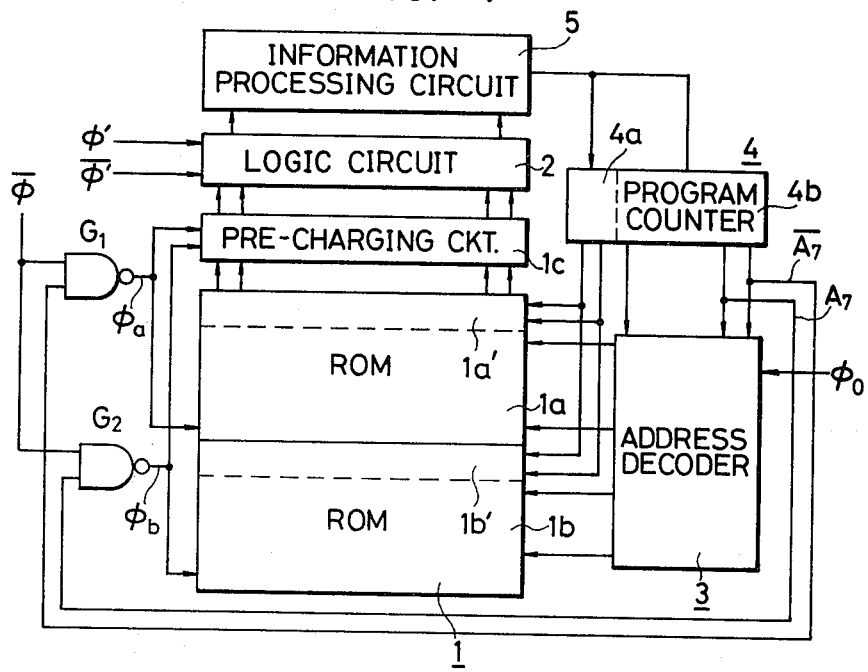
FIG. 7 is a circuit block diagram showing an example of application of this invention.

FIG. 7 is a block diagram showing an embodiment in the case where this invention has been applied to a digital control circuit.

Unlike a circuit of the so-called state logic system wherein random logic circuits disposed individually in correspondence with various functions are used to execute the respective information processing operations as predetermined, the digital control circuit of this embodiment is a circuit of the so-called dynamic logic system (PLA or ROM-RAM system) wherein control instructions written in a ROM are successively read out to operate the circuit which is used in common for the various operations.

Numeral 1 designates a longitudinal type ROM. Similarly to the longitudinal type ROM described before, it is constructed of longitudinal ROMs 1a and 1b including column select portions 1a' and 1b' respectively, and a precharging circuit 1c. A plurality of program instructions each having m bits are stored in the ROM 1. Although not especially restricted, each of the divided longitudinal ROMs 1a and 1b has 128 addresses. Each of the column select portions 1a' and 1b' receives 3 bits of column select signals. Accordingly, the longitudinal type ROM 1 has $(128 \times 2^3) \times 2$ or 2.048 program addresses.

A gate circuit $G_1$ is disposed in order to control the precharge operation and discharge operation, i.e., the sampling operation of the divided longitudinal ROM 1a. Likewise, a gate circuit $G_2$ is disposed in order to control the operation of the longitudinal ROM 1b. Essentially, one gate circuit suffices for each of the gate circuits $G_1$ and $G_2$. However, if necessary for driving precharge MISFETs and discharge MISFETs at high speed, a plurality of gate circuits for delivering the same signal may well be disposed so as to reduce the number of MISFETs which one gate circuit is to drive.

Output signals from the divided ROMs 1a and 1b are supplied to a logic circuit 2. Accordingly, the program instruction word composed of m bits is provided from the logic circuit 2.

Shown at 3 is an address decoder circuit (or AND array). The address decoder circuit 3 decodes 8 bits of address signals $A_0$, $\overline{A_0}$-$A_7$, $\overline{A_7}$ delivered from a program counter 4, and thereby provides address decode signals to be supplied to the divided longitudinal ROMs 1a and 1b.

Figure 8:
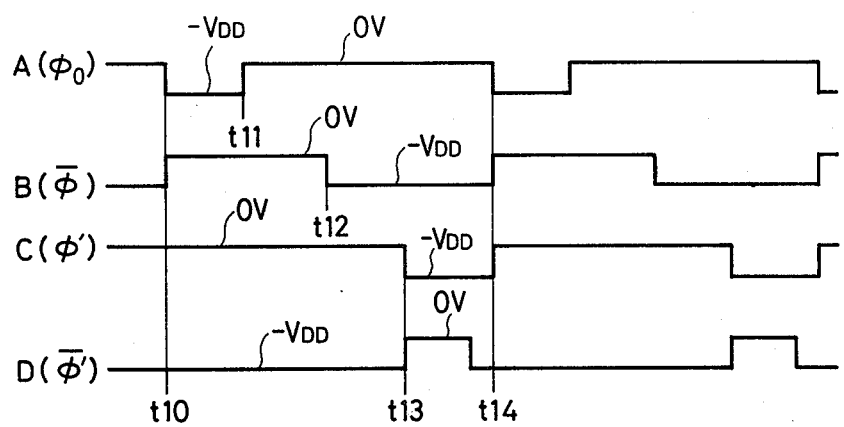
FIG. 8 is a timing chart of the circuit shown in FIG. 7.

Although not especially restricted, the address decoder circuit 3 is substantially constructed of a longitudinal ROM. Serially-connected MISFETs (not shown) which are supplied with the 8 bits of address signals $A_0$, $\overline{A_0}$-$A_7$, $\overline{A_7}$ are properly made the enhancement mode or the depletion mode, whereby the selection level of the address decode signal is made a low level and the non-selection level a high level. In this case, a clock pulse $\phi_0$ for operating the address decoder circuit 3, a clock pulse $\overline{\phi}$ for operating the longitudinal ROM 1 and sampling pulses $\phi'$ and $\overline{\phi'}$ for operating the logic circuit 2 are changed by way of example as shown in lines A to D of FIG. 8.

By making the clock pulse $\phi_0$ the low level at a time $t_{10}$, the precharge operation of the address decoder circuit 3 is started. Although this is not restrictive, the clock pulse $\overline{\phi}$ to be impressed on the gate circuits $G_1$ and $G_2$ is made the high level at the same time $t_{10}$. Accordingly, the precharge operation of the ROM 1 is also started at the time $t_{10}$.

By making the clock pulse $\phi_0$ the high level at a time $t_{11}$, the discharge operation of the address decoder circuit 3 is started.

At a time $t_{12}$ when the discharge operation of the address decoder circuit 3 has substantially ended, that is, when one of the address decode signals has been made the high level, the clock pulse $\overline{\phi}$ is made the low level. As a result, the discharge operation of the ROM 1 is started. At a time $t_{13}$ when the discharge operation of the ROM 1 has substantially ended, the sampling pulses $\phi'$ and $\overline{\phi'}$ are made the low level and the high level respectively. As a result, signals which correspond to signals provided from the ROM 1 are delivered from the logic circuit 2.

At a time $t_{14}$, the clock pulses $\phi_o$ and $\overline{\phi}$ are respectively made the low level and the high level again. Accordingly, the precharge operations of the address decoder circuit 3 and the ROM 1 are started. The output signals of the logic circuit 2 are held by capacitances existent at the corresponding output terminals until the sampling is started again.

The program counter 4 includes a portion 4a for holding 3 bits of address signals, and a portion 4b for holding 8 bits of address signals. The 3 bits of address signals are directly supplied to the column select portions 1a' and 1b' of the respective longitudinal ROMs 1a and 1b as the column select signals. The 8 bits of address signals are supplied to the address decoder circuit 3.

Numeral 5 indicates an information processing circuit which receives the program instruction of m bits delivered from the logic circuit 2. The information processing circuit 5 is constructed of an instruction decoder circuit which decodes the instruction word to form control signals required for a predetermined information processing operation, increment and jump control signals of the program counter, etc.; a RAM (random access memory) for holding data; a logic-arithmetic unit as well as various registers; and an input/output circuit (none of them being shown). It executes the predetermined information processing operation in accordance with the instruction words of the ROMs 1a and 1b.

This invention is not restricted to the foregoing embodiments. While the longitudinal type ROM has been described as the complementary type circuit, it may well be constructed of only p-channel MISFETs or only n-channel MISFETs.

The logic circuit 2, the gate circuits $G_1$ and $G_2$, etc. can be replaced with AND and OR circuits etc., depending upon signal levels.

The column select portions may well be omitted, and the ROM may well be divided into three or more parts.

In the logic circuit as shown in FIG. 10, when the signals a and b are changed at a comparatively low speed, the p-channel MISFETs and the n-channel MISFETs are simultaneously brought into the "on" states. Unless the MISFETs $Q_7$ and $Q_8$ are disposed, this will result in causing a penetrating current to flow across the supply voltage terminals. Therefore, the circuit of FIG. 10 includes the MISFETs $Q_7$ and $Q_8$ to be driven by the pulses $\phi'$ and $\overline{\phi'}$ in spite of being constructed of the CMOS circuit which has the feature that direct current becomes substantially zero. However, when the penetrating current may be neglected, the MISFETs $Q_7$ and $Q_8$ can be omitted. In this case, the output of the circuit of FIG. 10 may be held by an appropriate sample-and-hold circuit such as flip-flop circuit.

We claim:

1. A semiconductor memory device comprising:
    a first supply means which supplies a plurality of first input lines with first input signals;
    a second supply means which supplies a plurality of second input lines with second input signals;
    a first read-only memory which comprises a plurality of memory insulated-gate field effect transistors connected in series between a first output terminal and a first reference potential terminal and with their respective gates coupled to the corresponding first input lines;
    a second read-only memory which comprises a plurality of memory insulated-gate field effect transistors connected in series between a second output terminal and said first reference potential terminal and with their respective gates coupled to the corresponding second input lines;
    first precharge means, connected between a second reference potential terminal and said first output terminal including means for maintaining a first precharge signal in an "on" state when all said first input signals are made a second level, wherein said "on" state of said first precharge signal brings enhancement-mode insulated-gate field effect transistors which are formed in said first read-only memory into an "on" state;
    second precharge means connected between said second reference potential terminal and said second output terminal, including means for maintaining a second precharge signal in an "on" state when all said second input signals are made said second level;
    means for making at least one of said first input signals a first level when any of said second input signals is not made a first level, said first level of said signal bringing an enhancement-mode insulated-gate field effect transistor which is formed in said first read-only memory into an "off" state, and
    means for making at least one of said second input signals said first level when any of said first input signals is not made said first level.

2. A semiconductor memory device according to claim 1, further comprising:
    a third output terminal, and
    a logic circuit which logically combines a signal delivered to said first output terminal and a signal delivered to said second output terminal, thereby to deliver a signal to be supplied to said third output terminal.

3. A semiconductor memory device according to claim 2, wherein said first precharge means includes a first insulated-gate field effect transistor which is connected between said second reference potential terminal and said first output terminal, and a first gate circuit which supplies a clock pulse to a gate of said first insulated-gate field effect transistor, and said second precharge means includes a second insulated-gate field effect transistor which is connected between said second reference potential terminal and said second output terminal, and a second gate circuit which supplies a clock pulse to a gate of said second insulated-gate field effect transistor.

4. A semiconductor memory device according to claim 3, wherein said first read-only memory includes a third insulated-gate field effect transistor which is turned "on" and "off" complementarily to said first insulated-gate field effect transistor, and said second read-only memory includes a fourth insulated-gate field effect transistor which is turned "on" and "off" complementarily to said second insulated-gate field effect transistor.

5. A semiconductor memory device according to claim 4, wherein said insulated-gate field effect transistors constituting said first and second series circuits are made a first conductivity type, and said first and second insulated-gate field effect transistors are made a second conductivity type.

6. A semiconductor memory device according to claim 5, wherein said logic circuit has its operation controlled by a clock pulse.

7. A semiconductor memory device according to claim 4, wherein each of said first and second supply means comprises a decode circuit which forms said first and second input signals by decoding binary signals of a plurality of bits.

8. A semiconductor memory device according to claim 7, wherein each of said first and second gate circuits receives as a gate control signal a binary signal supplied to said decode circuit and also receives a clock pulse.

9. A semiconductor memory device according to claim 4, wherein said circuits are formed on a single semiconductor substrate, and said second read-only memory is connected to said second output terminal through an interconnection layer which is extended on an area forming said insulated-gate field effect transistors constituting said first read-only memory.

10. A semiconductor memory device according to claim 9, wherein each of said first and second read-only memories includes at least a first circuit which is constructed of a plurality of insulated-gate field effect transistors connected in series, and a second circuit which is constructed of a plurality of insulated-gate field effect transistors connected in series and which is connected in parallel with said first circuit.

* * * * *